(12) United States Patent
Ma

(10) Patent No.: US 9,413,338 B2
(45) Date of Patent: Aug. 9, 2016

(54) APPARATUSES, METHODS, AND CIRCUITS INCLUDING A DUTY CYCLE ADJUSTMENT CIRCUIT

(71) Applicant: Micron Technology, Inc., Boise, ID (US)

(72) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/285,328

(22) Filed: May 22, 2014

(65) Prior Publication Data

US 2015/0341021 A1    Nov. 26, 2015

(51) Int. Cl.
*H03K 3/017* (2006.01)
*H03K 3/037* (2006.01)
*H03K 5/156* (2006.01)

(52) U.S. Cl.
CPC .............. *H03K 3/017* (2013.01); *H03K 3/037* (2013.01); *H03K 5/1565* (2013.01)

(58) Field of Classification Search
CPC ...................................................... H03K 3/017
See application file for complete search history.

(56) References Cited

U.S. PATENT DOCUMENTS

| 5,727,037 | A  | 3/1998  | Maneatis |
| 5,757,218 | A  | 5/1998  | Blum |
| 5,923,613 | A  | 7/1999  | Tien et al. |
| 5,940,609 | A  | 8/1999  | Harrison |
| 6,281,725 | B1 | 8/2001  | Hanzawa et al. |
| 6,342,801 | B1 | 1/2002  | Shin |
| 6,388,480 | B1 | 5/2002  | Stubbs et al. |
| 6,452,432 | B2 | 9/2002  | Kim |
| 6,483,359 | B2 | 11/2002 | Lee |
| 6,489,823 | B2 | 12/2002 | Iwamoto |
| 6,498,512 | B2 | 12/2002 | Simon et al. |
| 6,518,807 | B1 | 2/2003  | Cho |
| 6,518,809 | B1 | 2/2003  | Kotra |
| 6,549,041 | B2 | 4/2003  | Waldrop |
| 6,573,771 | B2 | 6/2003  | Lee et al. |
| 6,583,657 | B1 | 6/2003  | Eckhardt et al. |
| 6,603,339 | B2 * | 8/2003 | Atallah et al. ................. 327/175 |
| 6,605,969 | B2 | 8/2003  | Mikhalev et al. |
| 6,650,190 | B2 | 11/2003 | Jordan et al. |
| 6,653,876 | B2 | 11/2003 | Issa et al. |
| 6,677,792 | B2 | 1/2004  | Kwak |
| 6,680,635 | B2 | 1/2004  | Lee |

(Continued)

OTHER PUBLICATIONS

Kuo-Hsing, et al., "A High Linearity, Fast-locking Pulsewidth Control Loop with Digitally Programmable Duty Cycle Correction for Wide Range Operation", Solid-State Circuits, vol. 43, Issue 2, Feb. 2008, 399-413.

(Continued)

*Primary Examiner* — Ryan Jager
(74) *Attorney, Agent, or Firm* — Dorsey & Whitney LLP

(57) ABSTRACT

Apparatuses, methods, and duty cycle correction circuits are described. An example apparatus includes a duty cycle correction (DCC) adjustment circuit configured to receive an input signal, and to adjust a duty cycle of the input signal to provide an output signal. The DCC circuit including a coarse adjust control circuit configured to adjust the duty cycle of the input signal by a first amount that is equal to one or more unit adjustments, and a fine adjust control circuit that is configured to adjust the duty cycle of the input signal responsive to a pulse signal by a second amount that is less than the unit adjustment.

20 Claims, 6 Drawing Sheets

(56) References Cited

U.S. PATENT DOCUMENTS

| | | | |
|---|---|---|---|
| 6,703,879 B2 | 3/2004 | Okuda et al. | |
| 6,765,421 B2 | 7/2004 | Brox et al. | |
| 6,774,690 B2 | 8/2004 | Baker et al. | |
| 6,788,120 B1 | 9/2004 | Nguyen | |
| 6,853,225 B2 | 2/2005 | Lee | |
| 6,853,226 B2 | 2/2005 | Kwak et al. | |
| 6,859,081 B2 | 2/2005 | Hong et al. | |
| 6,917,229 B2 | 7/2005 | Cho | |
| 6,934,215 B2 | 8/2005 | Chung et al. | |
| 6,940,328 B2 | 9/2005 | Lin | |
| 6,967,514 B2 | 11/2005 | Kizer et al. | |
| 7,116,143 B2 | 10/2006 | Deivasigamani et al. | |
| 7,120,839 B2 | 10/2006 | Fayneh et al. | |
| 7,208,989 B2 | 4/2007 | Gomm et al. | |
| 7,250,798 B2 | 7/2007 | Gomm et al. | |
| 7,423,467 B1* | 9/2008 | Simon | 327/175 |
| 7,515,669 B2 | 4/2009 | Shiah et al. | |
| 7,570,094 B2 | 8/2009 | Mnich | |
| 7,705,649 B1 | 4/2010 | Yu et al. | |
| 7,839,192 B1 | 11/2010 | Wang | |
| 7,990,194 B2 | 8/2011 | Shim | |
| 8,154,331 B2* | 4/2012 | Kim et al. | 327/175 |
| 2001/0026183 A1 | 10/2001 | Kim | |
| 2003/0099321 A1 | 5/2003 | Juan et al. | |
| 2004/0008064 A1 | 1/2004 | Kashiwazaki | |
| 2004/0012428 A1 | 1/2004 | Yee et al. | |
| 2004/0027182 A1 | 2/2004 | Brox et al. | |
| 2004/0066873 A1 | 4/2004 | Cho et al. | |
| 2004/0150447 A1 | 8/2004 | Chang | |
| 2004/0155686 A1 | 8/2004 | Kim et al. | |
| 2004/0178835 A1 | 9/2004 | Kim | |
| 2004/0189364 A1 | 9/2004 | Lee et al. | |
| 2006/0145745 A1 | 7/2006 | Gomm et al. | |
| 2006/0202732 A1 | 9/2006 | Deivasigamani et al. | |
| 2006/0209620 A1 | 9/2006 | Gomm et al. | |
| 2007/0252631 A1 | 11/2007 | Kaviani et al. | |
| 2008/0191767 A1* | 8/2008 | Koo | 327/175 |
| 2009/0058483 A1* | 3/2009 | Shin et al. | 327/175 |
| 2009/0289679 A1* | 11/2009 | Kuroki et al. | 327/175 |
| 2011/0110412 A1 | 5/2011 | Shin | |
| 2011/0248752 A1 | 10/2011 | Willey et al. | |
| 2013/0229216 A1* | 9/2013 | Wu et al. | 327/175 |
| 2014/0125390 A1* | 5/2014 | Ma | 327/175 |
| 2015/0002201 A1* | 1/2015 | Kitagawa et al. | 327/175 |

OTHER PUBLICATIONS

Tatsuya, et al., "A 1-Bv/s/pin 512-Mb DDRII SDRAM Using a Digital DLL and a Slew-Rate-Controlled Output Buffer", IEEE Journal of Solid-State Circuits, vol. 38, No. 5, May 2003, 762-768.

Yi-Ming, et al., "An all-digital 50% duty-cycle corrector", Circuits and Systems, vol. 2, ISCAS '04. Proceedings of the 2004 International Symposium, May 2004, 925-928.

* cited by examiner

APPARATUSES, METHODS, AND CIRCUITS INCLUDING A DUTY CYCLE ADJUSTMENT CIRCUIT

DESCRIPTION OF RELATED ART

Duty cycle correction (DCC) circuits are designed to adjust a duty cycle of a clock signal by applying the clock signal to a delay circuit. The amount of delay provided by the delay circuit of the DCC circuit is based on a detected duty cycle of a clock signal provided at an output. As clock frequencies increase, duty cycle step variance and non-uniform delay step sizes of the delay circuit may cause issues with reliability and robustness in circuitry to which the output signal is provided from the delay circuit. Additionally, integrated circuits continue to decrease in size and are increasingly integrated in mobile devices. Conventional DCC circuits may also have limited adjustment resolution (e.g., step sizes on the order of 4 ps or greater), and methods for improving the adjustment resolution generally lead to increased power consumption, increase in size, or have limited range. Due to the constraints on size and power consumption, DCC circuits that increase in size and/or increase power consumption may be impractical.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
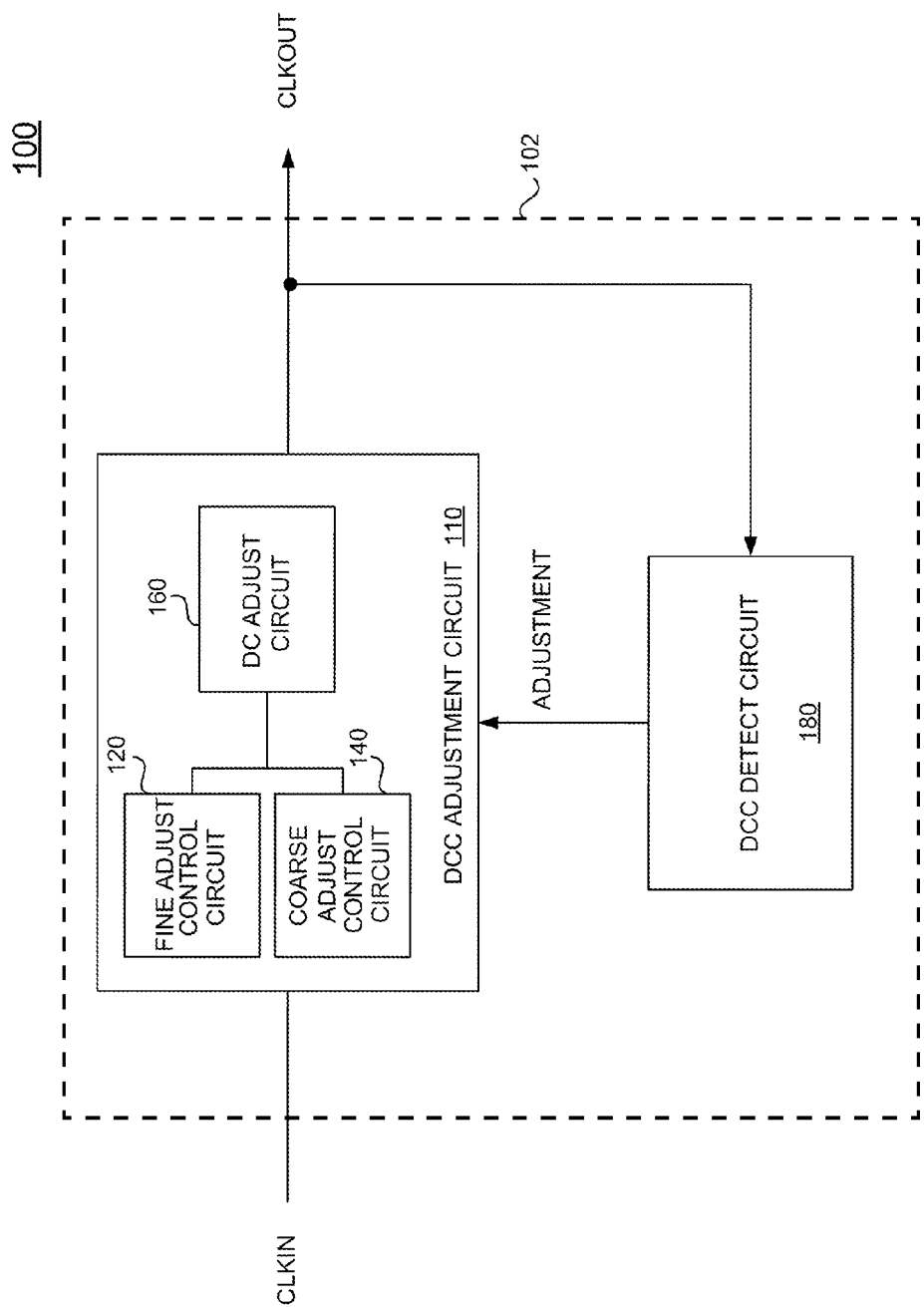
FIG. 1 is a block diagram of a particular illustrative embodiment of an apparatus including a duty cycle correction circuit according to an embodiment of the disclosure.

Referring to FIG. 1, a schematic block diagram of an apparatus 100 including a duty cycle correction (DCC) circuit 102 according to an embodiment. The DCC circuit 102 may be configured to adjust a duty cycle of an input clock signal CLKIN to provide an output clock signal CLKOUT. The DCC circuit 102 may include DCC adjustment circuit 110 coupled to a DCC detection circuit 180. The DCC detection circuit 180 may be configured to detect a duty cycle of the CLKOUT signal and provide adjustment signals to the DCC adjustment circuit 110. The DCC adjustment circuit 110 may adjust the duty cycle of the CLKIN signal to provide the CLKOUT signal based on adjustments signal from the DCC detection circuit 180.

The DCC adjustment circuit 110 may include a fine adjust control circuit 120 and a coarse adjust control circuit 140 each coupled to a duty cycle adjust circuit 160. The coarse adjust control circuit 140 may provide coarse control signals to the duty cycle adjust circuit 160 to adjust a duty cycle of the CLKIN signal by a first amount (e.g., a coarse adjustment) through the duty cycle adjust circuit 160. The fine adjust control circuit 120 may provide a fine bias control signal to the duty cycle adjust circuit 160 to adjust a duty cycle of the CLKIN signal by a second amount (e.g., fine adjustment) through the duty cycle adjust circuit 160. The first amount may be equal to one or more unit adjustments of the duty cycle adjust circuit 160 and the second amount may be less than the unit adjustment of the duty cycle adjust circuit 160. In some embodiments, the duty cycle adjust circuit 160 may include a plurality of duty cycle (DC) adjust elements, such as bias controlled inverters. The coarse adjust control circuit 140 may provide the coarse control signals to enable one or more of the plurality of DC adjust elements of the duty cycle adjust circuit 160. The unit adjustment may be equal to an adjustment of an enabled one of the DC adjust elements. The fine adjust control circuit 120 may provide the fine bias control signal to adjust a drive strength (e.g., current drive strength) and/or adjust a phase interpolation of at least one of the plurality of DC adjust elements, which alters a delay characteristic of the at least one of the plurality of DC adjust elements. The combination of the one or more DC adjust elements enabled by the coarse adjust control circuit 140 and the at least one DC adjust element having the adjusted drive strength based on the fine bias control signal from the fine adjust control circuit 120 may adjust the duty cycle of the CLKIN signal to provide the CLKOUT signal. In some embodiments, the step size adjustment provided by the coarse adjust control circuit 140 may be equal to one DC adjust element, and the step size adjustment provided by the fine adjust control circuit 120 may be less than one DC adjust element. In some embodiments, the step-size adjustment by the fine adjust control circuit 120 may be less than 1 picosecond.

In operation, the DCC adjustment circuit 110 may receive the CLKIN signal at an input and provide the CLKOUT signal at an output. The CLKOUT signal may be provided to clock distribution circuitry (not shown). The DCC detection circuit 180 may receive the CLKOUT signal from the output of the DCC adjustment circuit 110 (or later from a remote signal path), and determine a duty cycle of the CLKOUT signal. Responsive to determining that the duty cycle of the CLKOUT signal is outside of a target duty cycle range, the DCC detection circuit 180 may provide adjustment signals to the DCC adjustment circuit 110 to adjust the duty cycle of the CLKIN signal. For example, a target duty cycle range may be 50%, and a target range may be some percentage within the target 50% duty cycle. The DCC adjustment circuit 110 may adjust the duty cycle of the CLKIN signal responsive to receiving the adjustment signals.

As previously described, the coarse adjust control circuit 140 and the fine adjust control circuit 120 of the DCC adjustment circuit 110 may receive the adjustment control signals. The coarse adjust control circuit 140 may provide the coarse control signals to the duty cycle adjust circuit 160 to enable one or more of the DC adjust elements to adjust a duty cycle of the CLKIN signal by a first amount. The first amount may be equal to one or more unit adjustments of the duty cycle adjust circuit 160. The fine adjust control circuit 120 may provide the fine bias control signals to the duty cycle adjust circuit 160 to adjust a drive strength of one or more of the DC adjust elements to adjust a duty cycle of the CLKIN signal by a second amount. The second amount may be less than the unit adjustment of the duty cycle adjust circuit 160. In some embodiments, the coarse control signals provided by the coarse adjust control circuit 140 may each be set to one of a logical high value or a logical low value. The fine bias control signal from the fine adjust control circuit 120 may be set within a range of voltages between a high voltage (e.g., VCC) and a low voltage (e.g., ground). The coarse adjust control circuit 140, used in combination with the fine adjust control circuit 120, may provide duty cycle adjustments to the CLKIN signal having step sizes less than 1 ps.

Figure 2:
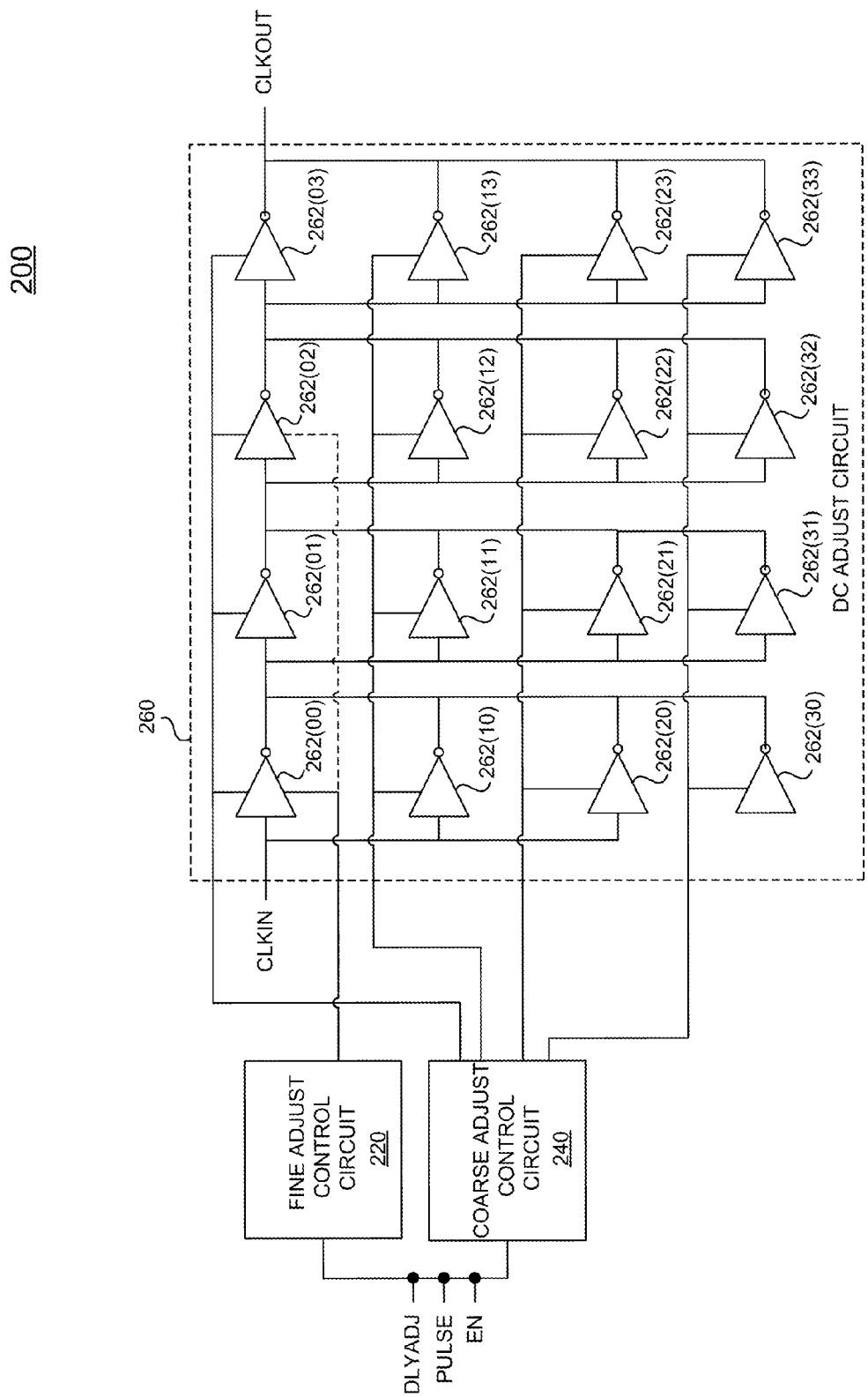
FIG. 2 is a block diagram of a particular illustrative embodiment of a duty cycle correction adjustment circuit according to an embodiment of the disclosure.

Referring to FIG. 2, a schematic block diagram of a DCC adjustment circuit 200 according to an embodiment of the invention. The DCC adjustment circuit 200 may be used to implement the DCC adjustment circuit 110 of FIG. 1. The DCC adjustment circuit 200 may include a duty cycle adjust circuit 260, a coarse adjust control circuit 240, and a fine adjust control circuit 220. The duty cycle adjust circuit 260, the coarse adjust control circuit 240, and the fine adjust control circuit 220 may be used to implement the duty cycle adjust circuit 160, the coarse adjust control circuit 140, and the fine adjust control circuit 120 of FIG. 1, respectively.

The duty cycle adjust circuit 260 may include a plurality of DC adjust elements 262(00-33) that may be arranged in any number of rows and/or columns. The duty cycle adjust circuit 260 may for example, include 4 columns and 4 rows, or may include 8 columns and 8 rows of DC adjust elements 262(00-33). Each of the duty cycle (DC) adjust elements 262(00-30) may be configured to receive the CLKIN signal and the DC adjust elements 262(30-33) may be configured to provide a duty cycle adjusted output clock signal CLKOUT. Each of the DC adjust elements 262(01-22) may be coupled to the output of each of the DC adjust elements 262(00-30). Any number of rows of the DC adjust elements 262(00-33) may be coupled to the coarse adjust control circuit 240. In some embodiments, the fine adjust control circuit 220 may be coupled to a single DC adjust element, such as the DC adjust element 262(00). In other embodiments, the fine adjust control circuit 220 may be coupled to a plurality of DC adjust elements, such as the DC adjust element 262(00) and the DC adjust element 262(02).

The coarse adjust control circuit 240 may be configured to receive a delay adjust signal DLYADJ and a pulse signal PULSE, and may selectively enable one or more of the DC adjust elements 262(00-33) of the duty cycle adjust circuit 260 based on a value of the DLYADJ signal and responsive to the PULSE signal. In some embodiments, the coarse adjust control circuit 240 may be configured to independently enable each DC adjust element 262(00-33). In other embodiments, the coarse adjust control circuit 240 may be configured to independently enable individual or rows or columns of DC adjust elements 262(00-33). By enabling one or more of the DC adjust elements 262(00-33), the rise and/or fall time of the CLKIN signal provided to the duty cycle adjust circuit 260 may be adjusted by a first amount (e.g., coarse adjustment).

The fine adjust control circuit 220 may be configured to receive the DLYADJ signal and the PULSE signal, and may selectively adjust a drive strength of at least one of the DC adjust elements 262(00-33) of the duty cycle adjust circuit 260 to which the fine control logic is coupled (e.g., the DC adjust element 262(00)). By adjusting the drive strength of the DC adjust element 262(00) in this manner, the rise and/or fall time of the CLKIN signal provided to the duty cycle adjust circuit 260 may be adjusted by a second amount (e.g., fine adjustment). A step size adjustment of the coarse adjustment may be greater than a step size adjustment of the fine adjustment. The DCC adjustment circuit 200 may have a hybrid architecture that combines coarse unit adjustments enabled by the coarse adjust control circuit 240 and a range of fine delay controlled by the fine adjust control circuit 220 to provide sub-unit adjustment duty cycle adjustment.

In operation of the DCC adjustment circuit 200, the coarse adjust control circuit 240 and the fine adjust control circuit 220 may each receive the DLYADJ and PULSE signals. The DLYADJ and PULSE signals may be provided by a DCC detect circuit, such as the DCC detection circuit 180 of FIG. 1. Responsive to the PULSE signal, the coarse adjust control circuit 240 may selectively enable one or more of the DC adjust element 262(00-33) based on a value of the DLYADJ signal to adjust the duty cycle of the CLKIN signal by a first amount. Responsive to the PULSE signal, the fine adjust control circuit 220 may adjust a current drive through the DC adjust element 262(00) based on a value of the DLYADJ signal to adjust the duty cycle of the CLKIN signal by a second amount. The first amount and the second amount of adjustment to the duty cycle of the CLKIN signal may be combined to provide the CLKOUT signal at an output of the duty cycle adjust circuit 260. In some examples, the step size of first amount of adjustment is larger (e.g., coarser) than the step size of the second amount of adjustment. For example, a unit adjustment may be equal to an adjustment to the CLKIN signal caused by a single one of the DC adjust elements 262(00-33) being enabled. The first amount may be equal to one or more of the unit adjustments, and the second amount may be less than the unit adjustment. In some embodiments, responsive to the PULSE signal, the fine adjust control circuit 220 may also adjust a current drive of a second DC adjust element 262(02) based on a value of the DLYADJ signal.

While FIG. 2 depicts the DC adjust circuit 260 having columns of 4 DC adjust elements and rows of 4 DC adjust elements, it is appreciated that the DC adjust circuit 260 may have columns and/or rows of more or less than 4 DC adjust elements. The fine adjust control circuit 220 that adjusts a current drive of the DC adjust element 262(00) may allow the DCC adjust circuit 200 to have an adjustment resolution of less than 1 ps.

Figure 3:
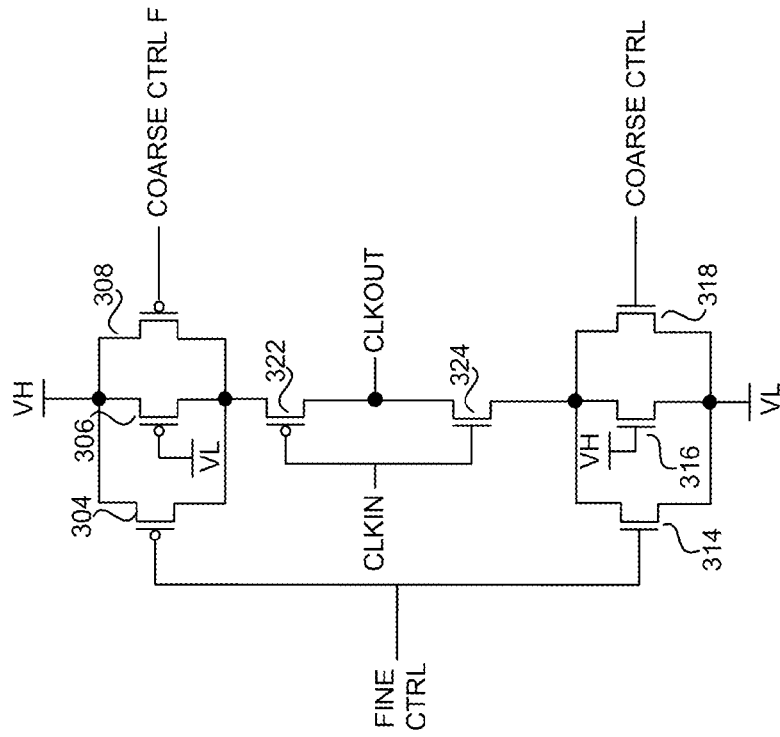
FIG. 3 is a block diagram of a particular illustrative embodiment of a DC adjust element according to an embodiment of the disclosure.

FIG. 3 is a schematic diagram of a DC adjust element 300 according to an embodiment of the invention. The DC adjust element 300 may be used to implement one or more of the DC adjust elements 262(00-33) of FIG. 2, such as the DC adjust element 262(00) coupled to the fine adjust control circuit 220 and the coarse adjust control circuit 240. The DC adjust element 300 may include transistors 306, 322, 324, and 316, which may be configured to operate as an inverter (e.g., CMOS inverter). For example, transistors 322 and 324 may be configured to receive an input clock signal CLKIN at their respective gates and provide an output clock signal CLKOUT having a clock level opposite of the CLKIN signal (e.g., provide a high clock level CLKOUT signal responsive to a low clock level CLKIN signal and provide a low clock level CLKOUT signal responsive to a high clock level CLKIN signal). The transistor 306 may be coupled to a first voltage source that provides a first voltage VH and the transistor 316 may be coupled to a second voltage source that provides a second voltage VL. The VH voltage is typically greater than the VL voltage, for example, the VH voltage may be a source voltage VCC and the VL voltage may be ground. The VH voltage represents the voltage of a high clock level and the VL voltage represents the voltage of a low clock level. Transistors 306 and 316, each coupled to receive the second and first voltages VL and VH, respectively, at a respective gate. The transistors 306 and 316 may determine the basic drive strength of the DC adjust element 300. This may, for instance, regulate step size linearity of the clock signal OUT.

The DC adjust element 300 may include transistors 304, 308 that may be coupled in parallel to the transistor 306, and transistors 314 and 318 that may be coupled in parallel to transistor 416. The transistors 304 and 314 may be configured to receive the fine control signal FINE BIAS. The FINE CTRL signal may be provided from a fine adjust control circuit, such as the fine adjust control circuit 120 of FIG. 1 and/or the fine adjust control circuit 220 of FIG. 2. The transistors 318 and 308 may be configured to receive the coarse control signal COARSE CTRL and inverted coarse control signal COARSE CTRL F, respectively. The COARSE CTRL and COARSE CTRL F signals may be provided from a coarse adjust control circuit, such as the coarse adjust control circuit 140 of FIG. 1 and/or the coarse adjust control circuit 240 of FIG. 2.

The transistors 304, 308, 314, and 318 may each be configured to have any transistor dimensions, and further may be configured to have different transistor dimensions. In one embodiment, using channel width of the transistors as an example of transistor dimensions, for example, the ratio of channel widths between the transistors 304, 314 may be configured such that in response to the FINE CTRL signal, the drive strength of the DC adjust element 300 is adjusted to apply a sub-unit adjustment to the CLKIN signal. Further, the ratio of channel widths between the transistors 308, 318 may be configured such that in response to the COARSE CTRL and COARSE CTRL F signals, the DC adjust element 300 is turned on to apply a unit adjustment to the CLKIN signal.

Adjusting the drive strength in this manner may, for instance, increase the rate at which the DC adjust element 300 may transition the CLKOUT signal from a first clock level to a second clock level. Additionally or alternatively, adjusting the drive strength in this manner may decrease the rate at which the DC adjust element 300 may transition the CLKOUT signal from the second logical state to the first logical state. As an example, the ratio of the transistors 304, 314 and/or transistors 308, 318 may be configured such that the rise time of the CLKOUT signal is increased and/or the fall time of the CLKOUT signal is decreased. Transistor 304 and/or transistor 308 may have a larger channel width than the transistor 314 and/or transistor 318 (e.g., twice the channel width), or may have a channel width such that the ratio between the channel widths of transistors 304, 314 and/or transistor 308, 318 is greater than 1 and less than 2.

In other embodiments, the rise time may be decreased and/or the fall time increased. The ratio between the channel widths of the transistors 308, 318 may be configured such that the drive strength is adjusted by an amount that results in a coarse adjustment of the duty cycle of the CLKIN signal, and the ratio between the channel widths of the transistors 304, 314 may be configured such that the drive strength is adjusted by an amount that results in a fine adjustment of the duty cycle of the CLKIN signal. The drive strength of the DC adjust element 300 may further be based, at least in part, on the ratio of channel widths between transistors 304, 308, and 306 and/or the ratio of channel widths between transistors 314, 318, and 316. For example, in one embodiment, transistor 304 and/or 308 may have a larger channel width than transistor 306, and transistor 314 and/or 318 may have a larger channel width than transistor 316. In another embodiment, transistors 304, 308 may have a smaller channel width than transistor 306, and transistor 314, 318 may have a smaller channel width than transistor 316. Moreover, in some embodiments, the ratio of the channel widths of transistors 304, 308 and/or transistors 314, 318 may be the same ratio as the transistors 306 and/or 316, respectively. Accordingly, the ratio between the channel widths of transistors 304, 314 and/or transistors 308, 318, and the ratio between the channel widths of transistors 306, 316 may be the same.

In an example operation, the DC adjust element 300 may receive the COARSE CTRL and COARSE CTRL F signals at the transistors 318, 308, respectively, for instance, from the coarse adjust control circuit 140 of FIG. 1 and/or the coarse adjust control circuit 240 of FIG. 2. In response, one or more of the transistors 308, 318 may be enabled. As previously described, enabling transistors 308, 318 may apply a unit adjustment of the DC adjust element 300 to the CLKIN signal. The COARSE CTRL and COARSE CTRL F signals may be complementary discrete signals where each signal is set to one of a logical high value or a logical low value. This may, for instance, adjust the rise time and/or fall time of the CLKOUT signal. As a result, the CLKOUT signal may have a duty cycle differing from that of the CLKIN signal. For example, in at least one embodiment, in response to the COARSE CTRL and COARSE CTRL F signals, the DC adjust element 300 may adjust the duty cycle of the clock cycle such that the duty cycle of the CLKOUT signal differs from the duty cycle of the CLKIN signal by a coarse adjustment (e.g., a unit adjustment).

Further, the FINE CTRL signal at the transistors 304, 314, for instance, from the fine adjust control circuit 120 of FIG. 1 and/or the fine adjust control circuit 220 of FIG. 2. In response, partially enabling the transistors 304, 314 may adjust the drive strength of the DC adjust element 300 to apply a sub-unit adjustment to the CLKIN signal. The FINE CTRL signal may be a bias signal having a voltage capable of being adjusted to any voltage within a range between a high (e.g., a VCC voltage) and low voltage (e.g., a VSS voltage). This may, for instance, adjust the rise time and/or fall time of the clock signal OUT, and as a result, the CLKOUT signal may have a duty cycle differing from that of the CLKIN signal. Adjusting the drive strength in response to the FINE CTRL signal may adjust the duty cycle of the clock cycle such that the duty cycle of the CLKOUT signal differs from the duty cycle of the CLKIN signal by a fine adjustment (e.g., sub-unit adjustment).

The DC adjust element 300 may simultaneously receive COARSE CTRL, COURSE BIAS F, and FINE CTRL signals such that the drive strength is changed by an amount that is a combination of the first (e.g., coarse) and second (e.g., fine) amounts. Accordingly, responsive to the COARSE CTRL, COURSE BIAS F, and FINE CTRL signals, the duty cycle of the CLKIN signal may be adjusted with both a coarse adjustment and a fine adjustment.

In some examples, the COARSE CTRL and COARSE CTRL F signals may be digitally controlled or analog. Further, in some examples, the FINE CTRL signal may be an analog bias, or digitally controlled to achieve higher precision and increase overall accuracy of the duty cycle adjustment. Thus in some examples, the DC adjust element 300 may be controlled by a hybrid of a coarse digital control and a fine analog bias. While the DC adjust element 300 has been described with respect to adjusting a duty cycle, it will be appreciated that the DC adjust element 300 may additionally or alternatively be used to adjust (e.g., modify) the timing of a signal in other ways. For example, the DC adjust element 300 may be included in a delay line, such as a delay line in a delay locked loop (DLL), to delay a signal. As another example, the DC adjust element 300 may be used to buffer an input signal or an output signal or adjust jitter and/or skew or a signal.

Figure 4:
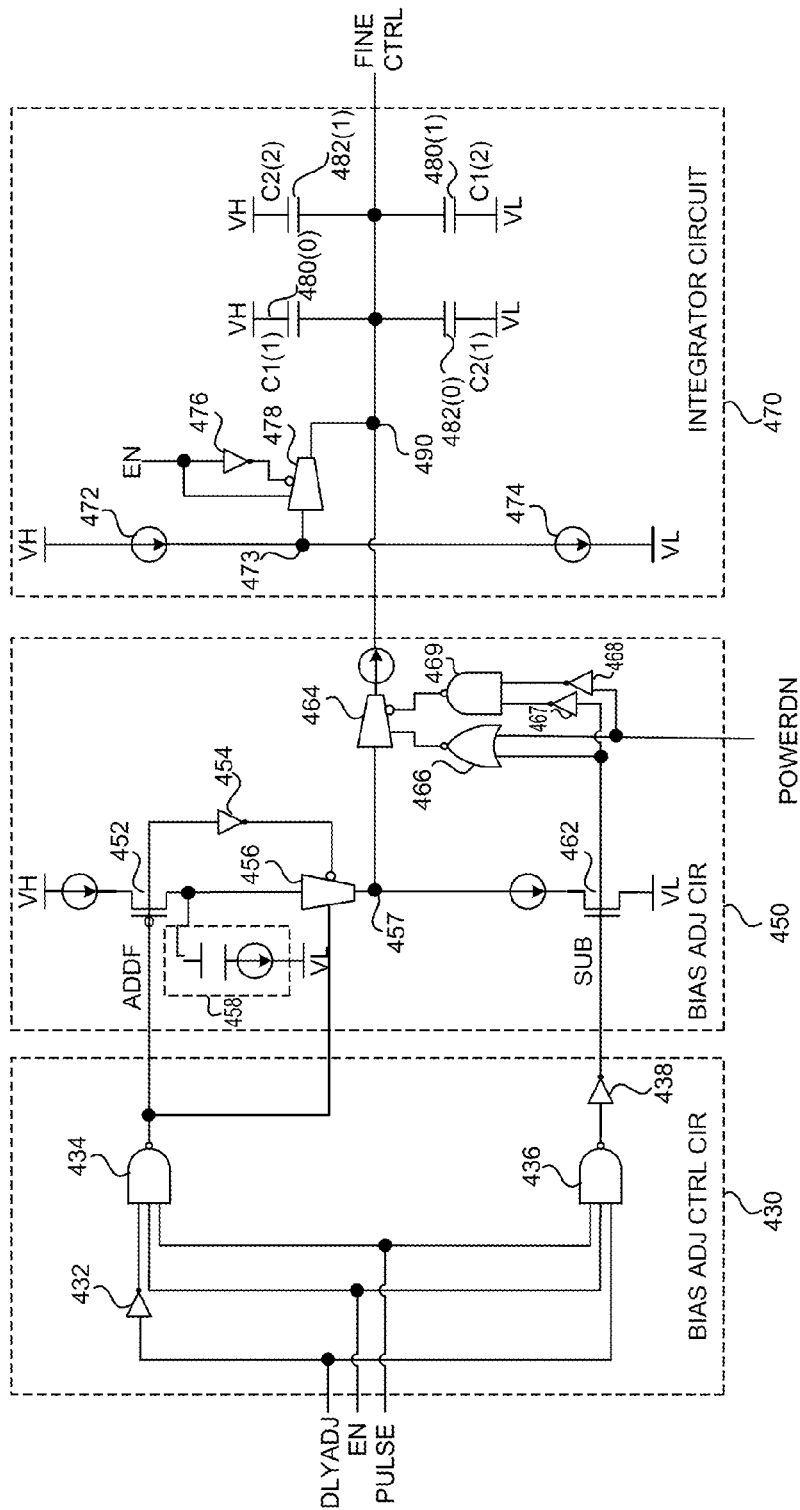
FIG. 4 is a block diagram of a particular illustrative embodiment of a fine adjust control circuit to an embodiment of the disclosure.

Referring to FIG. 4, a schematic block diagram of a fine adjust control circuit 400 according to an embodiment of the invention. The fine adjust control circuit 400 may be implemented in the fine adjust control circuit 120 of FIG. 1 and/or the fine adjust control circuit 220 of FIG. 2. The fine adjust control circuit 400 may include a bias adjust control circuit 430, bias adjust circuit 450 and an integrator circuit 470. The bias adjust control circuit 430 may be coupled to the bias adjust circuit 450, and the bias adjust circuit 450 may be coupled to the integrator circuit 470. The fine adjust control circuit 400 may provide a fine bias control signal FINE BIAS to a delay circuit from an output node 490, such as the duty cycle adjust circuit 160 of FIG. 1 and/or the duty cycle adjust circuit 260 of FIG. 2.

The bias adjust control circuit 430 may receive a DLYADJ signal, an enable signal EN, and a pulse signal PULSE. The bias adjust control circuit 430 may provide an ADDF signal and a SUB signal to the bias adjust circuit 450 based on the DLYADJ, EN, and PULSE signals. The bias adjust control circuit 430 may include a NAND gate 434 that receives an inverted DLYADJ signal via a inverter 432, the EN signal, and the PULSE signal, and provides the ADDF signal at an output. The bias adjust control circuit 430 may further include a NAND gate 436 that receives the DLYADJ signal, the EN signal, and the PULSE signal, and provides an output based on the received input signals. The output of the NAND gate 436 may be coupled to an inverter 438, which may provide the SUB signal at an output.

The bias adjust circuit 450 may receive the ADDF signal and the SUB signal, and may adjust a bias at an output node 490 based on the ADDF and SUB signals. The bias adjust circuit 450 may include a p-type transistor 452 coupled in series with a pass gate 456 and an n-type transistor 462. The pass gate 456 may be controlled based on the ADDF signal. For example, the pass gate 456 may be enabled when ADDF has a first logical value (e.g., a logical high value), and may be disabled when the ADDF signal has a second logical value (e.g., a logical low value). The bias adjust circuit 450 may further include a charge storage element 458 coupled to a node between the p-type transistor 452 and the pass gate 456, and may be configured to store a charge from the node between the p-type transistor 452 and the pass gate 456. The charge storage element 458 may include a capacitance and a current source coupled to a voltage source that provides a voltage VL. The bias adjust circuit 450 may further include a pass gate 464 coupled between an adjust node 457 and the output node 490. The pass gate 464 may be controlled by an output from a NOR gate 466 and an output from a NAND gate 469. The NOR gate 466 may receive the SUB signal and a power down signal POWERDN. In some embodiments, the POWERDN signal may be an active high signal (e.g., a high logical value indicates a power down mode). The NAND gate 469 may receive an inverted SUB signal via an inverter 467 and an inverted POWERDN signal via an inverter 468. When the SUB and POWERDN signals have the second logical values (e.g., logical low values), the NOR gate 466 may decouple the adjust node 457 from the output node 490. The outputs of the NOR gate 466 and NAND gate 469 may be complementary. Thus, while in normal operation (e.g., when there is not a power down), as indicated via an inactive POWERDN signal (e.g., the POWERDN signal has a logical low value), the pass gate 464 may couple the adjust node 457 to the output node 490 responsive to the SUB signal having a low logical value. Otherwise, the pass gate 464 may decouple the adjust node 457 from the output node 490.

The integrator circuit 470 may include a first current source 472 and a second current source 474 coupled in series between first and second voltage supplies providing the first and second voltages VH and VL, with current drive node 473 in between. In some embodiments, the first current source 472 and the second current source 474 may include a current mirror circuit. The integrator circuit 470 may further include a pass gate 478 coupled between the current driver node 473 and the output node 490. The pass gate 478 may be controlled by the EN signal (e.g., receive the EN signal at a first input and receive an inverted EN signal via an inverter 476 at a second input). For example, the pass gate 478 may couple the current driver node 473 to the output node 490 when the EN signal has a first logical value to drive a voltage of the output node 490. Further, the pass gate 478 may decouple the current driver node 473 from the output node 490 when the EN signal has a second logical value. The integrator circuit 470 may further include charge storing elements 480(0-1) and 482(0-1) (e.g., capacitors). It will be appreciated that the integrator circuit may include more or less than 4 charge storage elements. The integrator circuit 470 may be configured to integrate the charge at the output node 490 to provide the FINE CTRL signal at an output. The charge integration by the integrator circuit 470 may provide a relatively small change in voltage of the FINE CTRL signal to adjust a duty cycle with linear analog resolution, for example, by adjusting a delay of a delay circuit. The FINE CTRL signal may be provided to a DC adjust element of a duty cycle adjust circuit, such as the DC adjust element 262(00) of the duty cycle adjust circuit 260 of FIG. 2.

In operation, when enabled (e.g., the EN signal has a logical high value), the first current source 472 and the second current source 474 may charge the charge storage elements 480(0-1) and 482(0-1) and the output node 490 to a first bias voltage between VH and VL, and may hold the output node 490, and the FINE CTRL signal, at the bias voltage. When a power down mode is active, the POWERDN signal may have a logical high value, and the pass gate 464 may decouple the bias adjust circuit 450 from the integrator circuit 470 based on the POWERDN signal having the logical high value. The following discussion will assume the EN signal has a logical high value.

When in normal operation, the POWERDN signal has a logical low value and the bias adjust control circuit 430 and bias adjust circuit 450 may control adjustment of the bias voltage at the output node 490. While in normal operation, during a first mode of operation, the logic of the bias adjust control circuit 430 and the bias adjust circuit 450 may couple the charge storage element 458 to the output node 490 via the pass gate 456 and pass gate 464, and may decouple the charge storage element 458 from the VH and VL voltage sources. Thus, the charge storage element 458 may be charged to the first bias voltage of the output node 490 during the first mode of operation. The first mode of operation may be responsive to the PULSE signal having a logical low value. For example, based on the PULSE signal having a logical low value, the SUB signal provided from the NAND gate 436 via inverter 438 may have a logical low value, which may enable the pass gate 464 to couple the adjust node 457 to the output node 490. The SUB signal having the logical low value may also disable the n-type transistor 462 to decouple the adjust node 457 from the VL voltage source. Additionally, during the first mode, the ADDF signal may have a logical high value, which may enable the pass gate 456 to couple the charge storage element 458 to the adjust node 457, and disable the p-type transistor to decouple the VH voltage source from the charge storage element 458. Thus, during the first mode of operation, the charge storage element 458 may be coupled to the output node 490 via the pass gate 456 and the pass gate 464, and may be charged to the first bias voltage at the output node 490.

While remaining in the normal operation mode, the bias adjust control circuit 430 and bias adjust circuit 450 may switch to a second mode of operation responsive to a pulse of the PULSE signal to adjust a charge on the charge storage element 458 based on a value of the DLYADJ signal. That is, the logic of the bias adjust control circuit 430 may drive the logic of the bias adjust circuit 450 to decouple the charge storage element 458 from the output node 490, and charge or discharge the charge storage element 458 during the pulse while decoupled from the output node 490. For example, based on the PULSE signal having a logical high value (e.g., during a pulse), the SUB signal and the ADDF signals may have values based on values of the DLYADJ signal, which may be used by the logic of the bias adjust circuit 450 to increase or decrease a voltage on the charge storage element 458. In some examples, the DLYADJ signal having a logical high value may indicate an increase in duty cycle by decreasing the bias voltage of the output node 490. Additionally, the DLYADJ signal having a logical low value may indicate a decrease in duty cycle by increasing the bias voltage of the output node 490.

As an example, while the DLYADJ signal has a logical high value, the ADDF signal provided from the NAND gate 434 may have a logical high value and the SUB signal from the inverter 438 may have the logical high value. Based on the ADDF signal having a logical high value, the p-type transistor 452 may be disabled, and the VH voltage source may be decoupled from the charge storage element 458. Also based on the ADDF signal having the logical high value, the pass gate 456 may be enabled to couple the charge storage element 458 to the adjust node 457. Based on the SUB signal having the logical high value, the n-type transistor 462 may couple the adjust node 457 to the VL voltage and the pass gate 464 may decouple the adjust node 457 from the output node 490. Thus, the charge storage element 458 may be coupled to the VL voltage via the pass gate 456 and the n-type transistor 462, which may cause the charge storage element 458 to discharge from the first bias voltage.

Under the opposite scenario, when the DLYADJ signal has a logical low value, the ADDF signal provided from the NAND gate 434 may have a logical low value and the SUB signal from the inverter 438 may have the logical low value. Based on the ADDF signal having a logical low value, the p-type transistor 452 may couple the VH voltage source to the charge storage element 458. Also based on the ADDF signal having the logical low value, the pass gate 456 may be disabled and decouple the charge storage element 458 from the adjust node 457. Responsive to the charge storage element 458 being coupled to the VH voltage source, and electrically isolated from the adjust node 457, the charge storage element 458 may charge toward a voltage of the VH voltage source from the first bias voltage. Based on the SUB signal having the logical low value, the n-type transistor 462 may be disabled and decouple the adjust node 457 from the VL voltage and the pass gate 464 may couple the adjust node 457 to the output node 490.

Responsive to the PULSE signal returning to a logical low value, the fine adjust control circuit 400 may return to the first mode of operation. That is, the charge storage element 458 may be coupled to the adjust node 457 and to the output node 490 (via the pass gate 456 and pass gate 464) based on the ADDF signal having a logical high value and the SUB signal having a logical low value, and may be decoupled from the VH and VL voltage sources (e.g., via the p-type transistor 452 and the n-type transistor 462). Responsive to returning to the first mode of operation, the bias voltage at the output node 490 may increase or decrease based on an increased or decreased voltage, respectively, of the charge storage element 458 to reach a second bias voltage. The first current source 472 and the second current source 474 may hold the output node 490, along with the charge storage elements 480(0-1) and 482(0-1), at the second bias voltage.

An amount of voltage increase or decrease at the charge storage element 458 from the first bias voltage may be based, at least in part, on a length of a pulse on the PULSE signal. An amount of increase or decrease of the first bias voltage at the output node 490 may be based, at least in part, on relative differences in storage capacities between the charge storage element 458 and the charge storage elements 480(0-1) and 482(0-1), in addition to a magnitude of the increase or decrease of the voltage at the charge storage element 458 relative to the first bias voltage. The charge storage capacity of the charge storage element 458 may be less than a charge storage capacity of each of the charge storage elements 480(0-1) and 482(0-1). As previously described, the FINE CTRL signal having the bias voltage of the output node 490 may be provided to a delay circuit to adjust a duty cycle of a clock input signal. In some embodiments, the integrator may include circuitry that provides a second FINE CTRL F signal that is complementary to the FINE CTRL signal.

Figure 5:
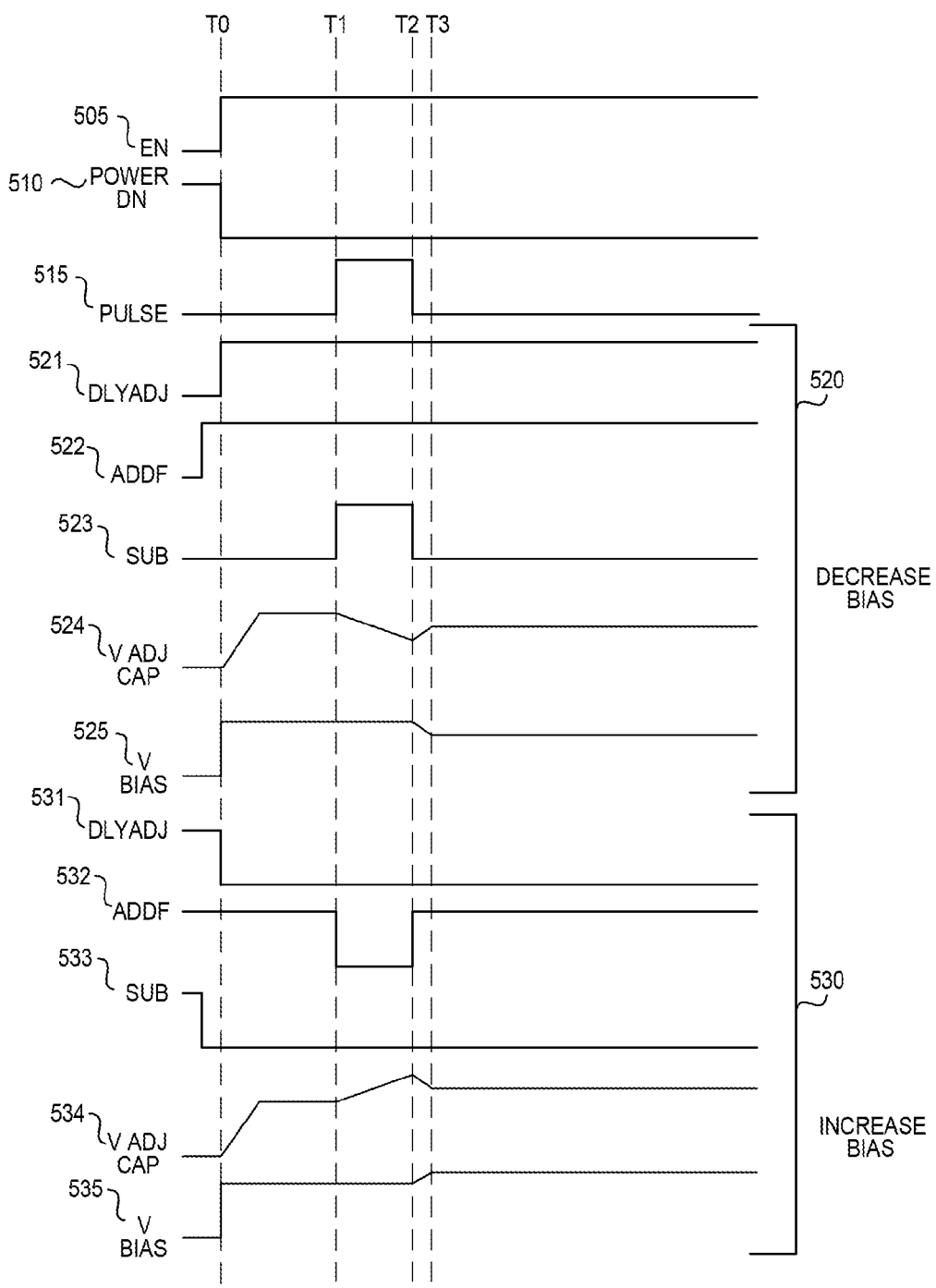
FIG. 5 is a an exemplary timing diagram depicting timing of a fine adjust control circuit according to an embodiment of the disclosure.

FIG. 5 illustrates an exemplary timing diagram depicting various signals propagating through circuitry of the fine adjust control circuit 400 of FIG. 4. The EN signal 505, the POWERDN signal 510, and the PULSE signal 515 may represent the EN, the POWERDN, and the PULSE signals, respectively of FIG. 4. The DLYADJ signal 531, ADDF signal 522, SUB signal 523, V ADJ CAP voltage 524, and V BIAS voltage 525 may represent the DLYADJ, ADDF, SUB, a voltage at the charge storage element 458, and the FINE CTRL signal of FIG. 4 during a decrease bias sequence 520. The DLYADJ signal 531, ADDF signal 532, SUB signal 533, V ADJ CAP voltage 534, and V BIAS voltage 535 may represent the DLYADJ, ADDF, SUB, a voltage at the charge storage element 458, and the fine bias control signals of FIG. 4 during an increase bias sequence 530.

At time T0, the EN signal 505 may transition to a logical high value and the POWERDN signal 510 may transition to a logical low value. The EN signal 505 transitioning to the logical high value may enable the pass gate 478 of FIG. 4. The POWERDN signal 510 transitioning to the logical low value may allow the pass gate 464 to be enabled/disabled via the SUB signal of FIG. 4.

During the decrease bias sequence 520, the DLYADJ signal 531 may have a logical high value. Prior to time T1, the ADDF signal 522 may have a logical high value (e.g., based on the values of the ENABLE signal 505, PULSE signal 515, and DLYADJ signal 531) and the SUB signal 523 may have a logical low value (e.g., based on the values of the ENABLE signal 505, PULSE signal 515, and DLYADJ signal 531). Responsive to the ADDF signal 522 having the logical high value, the pass gate 456 may be enabled to couple the charge storage element 458 to the adjust node 457. Responsive to the SUB signal 523 having the logical low value, the pass gate 464 may be enabled to couple the adjust node 457 to the output node 490. Thus, prior to time T1, the V ADJ CAP voltage 524 and V BIAS voltage 525 may both charge to a first bias voltage.

The PULSE signal 515 may have a pulse that starting at time T1 and ending at time T2. At time T1, responsive to the PULSE signal 515 transitioning to the logical high value, the SUB signal 523 may transition to the logical high value. The ADDF signal 522 may remain at the logical high value. Responsive to the SUB signal 523 transitioning to the logical high value, the pass gate 464 may be disabled and the n-type transistor 462 may be enabled. The pass gate 464 being disabled may decouple the output node 490 from the adjust node 457, and the V BIAS voltage 525 may remain at the bias voltage. The adjust node 457 may be decoupled from the output node 490 and coupled to the VL voltage source. Based on the pass gate 456 remaining enabled, the V ADJ CAP voltage 524 discharges toward the VL voltage between time T1 and T2.

At time T2, responsive to the PULSE signal 515 transitioning to the logical low value, the SUB signal 523 may transition to the logical low value. Responsive to the SUB signal 523 transitioning to the logical low value, the pass gate 464 may be enabled and the n-type transistor 462 may be disabled. The pass gate 464 being enabled may couple the output node 490 to the adjust node 457, and the V ADJ CAP voltage 524 and the V BIAS voltage 525 may begin ramping toward each other to reach a second bias voltage that is less than the first bias voltage. At the T3, the V ADJ CAP voltage 524 and V BIAS voltage 525 may reach the second bias voltage. A difference between the first bias voltage and the second bias voltage may be based on a length of the pulse of the PULSE signal 515 between times T1 and T2.

Turning now to the increase bias sequence 530, the DLYADJ signal 531 may have a logical low value at time T0. Prior to time T1, the ADDF signal 532 may have a logical high value (e.g., based on the values of the EN signal 505, PULSE signal 515, and DLYADJ signal 531) and the SUB signal 533 may have a logical low value (e.g., based on the values of the EN signal 505, PULSE signal 515, and DLYADJ signal 531). Responsive to the ADDF signal 532 having the logical high value, the pass gate 456 may be enabled to couple the charge storage element 458 to the adjust node 457. Responsive to the SUB signal 533 having the logical low value, the pass gate 464 may be enabled to couple the adjust node 457 to the output node 490. Thus, prior to time T1, the V ADJ CAP voltage 534 and V BIAS voltage 535 may both charge to a first bias voltage.

As previously described, the PULSE signal 515 may have a pulse starting at time T1 and ending at time T2. At time T1, responsive to the PULSE signal 515 transitioning to the logical high value, the ADDF signal 532 may transition to the logical low value. The SUB signal 533 may remain at the logical low value. Responsive to the ADDF signal 532 transitioning to the logical low value, the pass gate 456 may be disabled and the p-type transistor 452 may be enabled. The pass gate 456 being disabled may decouple the charge storage element 458 from the adjust node 457 (and the output node 490), and the V BIAS voltage 535 may remain at the bias voltage. The charge storage element 458 may be coupled to the VH voltage source via the p-type transistor 452, and the V ADJ CAP voltage 534 may charge toward the VH voltage between time T1 and T2.

At time T2, responsive to the PULSE signal 515 transitioning to the logical low value, the ADDF signal 532 may transition to the logical high value. Responsive to the ADDF signal 532 transitioning to the logical high value, the pass gate 456 may be enabled and the p-type transistor 452 may be disabled. The pass gate 456 being enabled may couple the charge storage element 458 to the adjust node 457 (and the output node 490, as the pass gate 464 remains enabled), and the V ADJ CAP voltage 534 and the V BIAS voltage 535 may begin ramping toward each other to reach a second bias voltage that is greater than the first bias voltage. At time T3, the V ADJ CAP voltage 534 and V BIAS voltage 535 may reach the second bias voltage. As previously described, a difference between the first bias voltage and the second bias voltage may be based on a length of the pulse of the PULSE signal 515 between times T1 and T2.

The timing diagram 500 is exemplary, and relative timing between signals may vary from the relative timing depicted. In some memory systems, the pulse of the PULSE signal 515 may be longer or shorter. Further, the relative voltage charge/discharge rates of the V ADJ CAP voltage 524, V BIAS voltage 525, V ADJ CAP voltage 534, and V BIAS voltage 535 may vary from the rates depicted.

Figure 6:
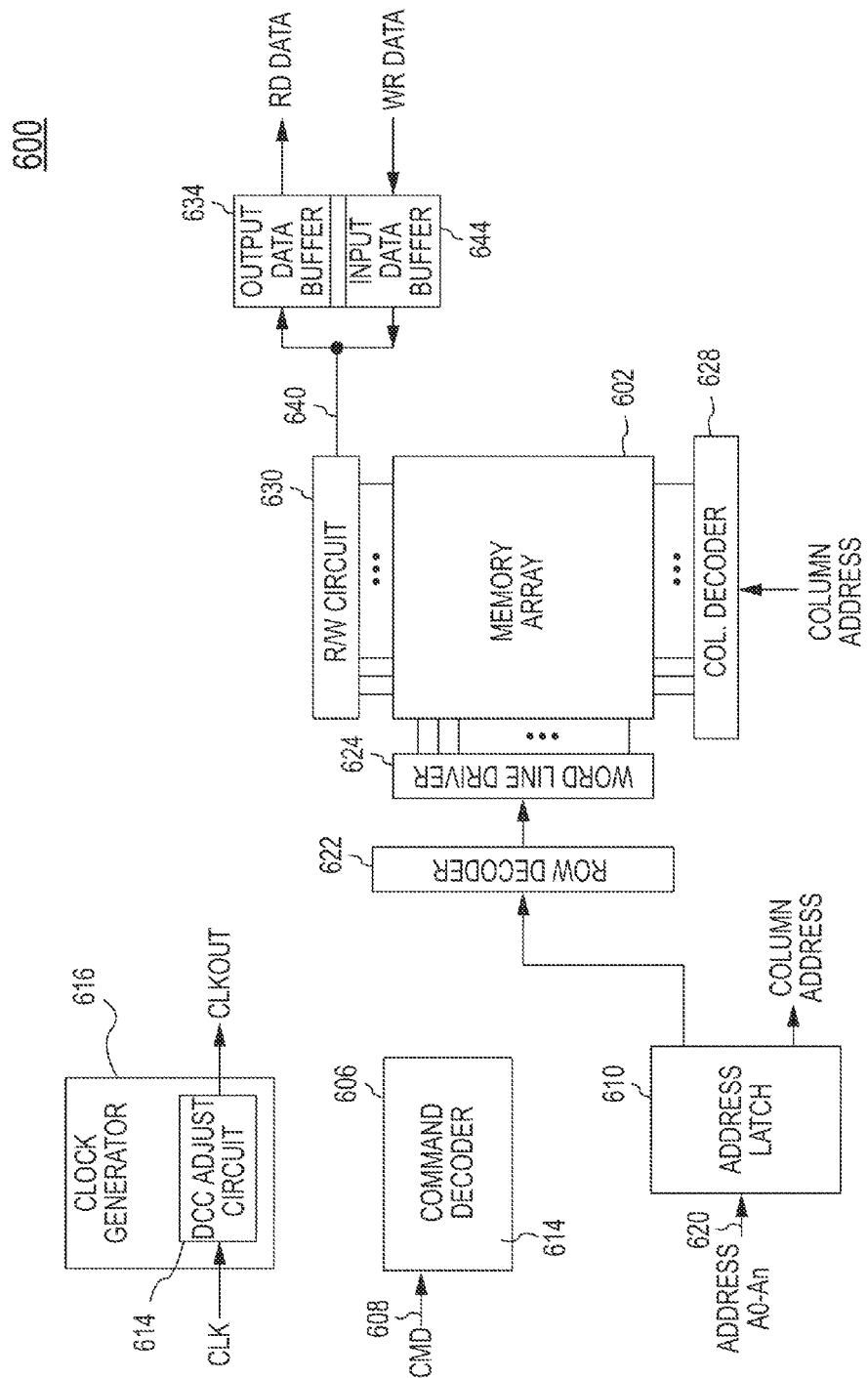
FIG. 6 is a block diagram of a memory including a delay circuit according to an embodiment of the disclosure.

Referring to FIG. 6, block diagram of a memory 600 including a DCC adjustment circuit 614 according to an embodiment of the invention. The memory 600 may include an array 602 of memory cells, which may be, for example, volatile memory cells (e.g., DRAM memory cells, SRAM memory cells), non-volatile memory cells (e.g., flash memory cells, phase change memory cells), or some other types of memory cells. The memory 600 includes a command decoder 606 that may receive memory commands through a command bus 608 and provide corresponding control signals within the memory 600 to carry out various memory operations. For example, the command decoder 606 may respond to memory commands provided to the command bus 608 to perform various operations on the memory array 602. In particular, the command decoder 606 may be used to provide internal control signals to read data from and write data to the memory array 602. Row and column address signals may be provided to an address latch 610 in the memory 600 through an address bus 620. The address latch 610 may then provide a separate column address and a separate row address.

The address latch 610 may provide row and column addresses to a row address decoder 622 and a column address decoder 628, respectively. The column address decoder 628 may select bit lines extending through the array 602 corresponding to respective column addresses. The row address decoder 622 may be connected to a word line driver 624 that activates respective rows of memory cells in the array 602 corresponding to received row addresses. The selected data line (e.g., a bit line or bit lines) corresponding to a received column address may be coupled to a read/write circuitry 630 to provide read data to an output data buffer 634 via an input-output data path 640. Write data may be provided to the memory array 602 through an input data buffer 644 and the memory array read/write circuitry 630.

The memory 600 may include a clock generator 616 that includes a DCC adjustment circuit 614. The DCC adjustment circuit 614 provides an output clock signal CLKOUT signal that may be used for clocking circuitry of the memory 600. The DCC adjustment circuit 614 may include the apparatus 100 of FIG. 1, DCC adjustment circuit 200 of FIG. 2, the DC adjust element 300 of FIG. 3, the fine adjust control circuit 400 of FIG. 4, or any combination thereof.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. An apparatus comprising:
   a duty cycle correction (DCC) adjustment circuit configured to receive an input signal, and to adjust a duty cycle of the input signal to provide an output signal, the DCC adjustment circuit comprising:
   a coarse adjust control circuit configured to configured to adjust the duty cycle of the input signal by a first amount that is equal to one or more unit adjustments; and
   a fine adjust control circuit configured to adjust the duty cycle of the input signal responsive to a pulse signal by a second amount that is less than a unit adjustment, wherein the fine adjust control circuit comprises a bias adjust circuit including a charge storage element, wherein the bias adjust circuit is configured to change a voltage of the charge storage element from a first voltage to a second voltage responsive to the pulse signal, wherein the second amount of adjustment to the duty cycle of the input signal is based on a difference between the first voltage and the second voltage.

2. The apparatus of claim 1, wherein the fine adjust control circuit further comprises an integrator circuit configured to provide a fine control signal having a first bias voltage from an output node prior to receiving the pulse of the pulse signal, wherein the integrator circuit is configured to provide the fine control signal from the output node having a second bias voltage after the pulse signal, wherein the difference between the first bias voltage and the second bias voltage is based on the second voltage of the charge storage element of the bias adjust circuit.

3. The apparatus of claim 2, wherein the charge storage element is coupled to the output node prior to the pulse, wherein the charge storage element has the first bias voltage prior to the pulse of the pulse signal, wherein the charge storage element has the second bias voltage after the pulse of the pulse signal.

4. The apparatus of claim 1, wherein the bias adjust circuit further comprises:
   a first pass gate coupled between the charge storage element and the output node, the first pass gate configured to be enabled based on a first control signal, wherein a value of the first control signal is based on the pulse signal; and
   a second pass gate coupled between the charge storage element and the output node, the second pass gate configured to be enabled based on a second control signal, wherein a value of the second control signal is based on the pulse signal.

5. The apparatus of claim 4, wherein the first pass gate is coupled in series with the second pass gate.

6. The apparatus of claim 4, wherein the bias adjust circuit further comprises:
   a first transistor coupled between a first voltage source and the first pass gate; the first transistor configured to couple the first voltage source to the charge storage element based on a value of the first control signal; and
   a second transistor coupled between a second voltage source and a node between the first pass gate and the second pass gate, the second transistor configured to couple the second voltage source to the node between the first pass gate and the second pass gate based on a value of the second control signal.

7. The apparatus of claim 6, wherein the first transistor is a p-type transistor and the second transistor is an n-type transistor.

8. The apparatus of claim 4, wherein the fine adjust control circuit further comprises a bias adjust control circuit coupled to the bias adjust circuit, the bias adjust control circuit configured to receive the pulse signal and a delay adjust signal, the bias adjust control circuit configured to provide the first control signal having a value based on a value of the pulse signal and an inverted value of the delay adjust signal, the bias adjust control circuit configured to provide the second control signal having a value based on a value of the pulse signal and a value of the delay adjust signal.

9. The apparatus of claim 8, wherein the bias adjust control circuit comprises:
   a first inverter configured to receive the delay adjust signal and to provide the inverted value of the delay adjust signal;
   a first logic gate configured to receive the inverted value of the delay adjust signal and the pulse signal, the first logic gate configured to provide the first control signal having a value based on the value of the pulse signal and the inverted value of the delay adjust signal;
   a second logic gate configured to receive the delay adjust signal and the pulse signal, the second logic gate configured to provide an inverted second control signal having a value based on the value of the pulse signal and the value of the delay adjust signal; and
   a second inverter coupled to the second logic gate and configured to invert the inverted second control signal to provide the second control signal.

10. A duty cycle correction circuit comprising:
    a duty cycle correction (DCC) adjustment circuit configured to receive an input signal, and to adjust a duty cycle of the input signal to provide an output signal, the DCC adjustment circuit comprising:
    a duty cycle adjust circuit comprising a plurality of duty cycle adjust elements;
    a coarse adjust control circuit coupled to each of the plurality of duty cycle adjust elements, the coarse adjust control circuit configured to enable one or more of the plurality of duty cycle adjust elements to adjust a duty cycle of the input circuit by a first amount that is equal to a sum of unit adjustments of the one or more of the plurality of duty cycle adjust elements based on adjustment signals; and
    a fine adjust control circuit coupled to a duty cycle adjust element of the plurality of duty cycle adjust elements, the fine adjust control circuit configured to adjust a drive strength of the duty cycle adjust element of the plurality of duty cycle adjust elements to adjust the duty cycle of the input circuit by a second amount that is less than the unit adjustment, wherein the fine adjust control circuit comprises:
    an integrator configured to provide a fine control signal to the duty cycle adjust element of the plurality of duty cycle adjust elements, wherein the second amount is based on a voltage of the fine control signal, wherein the integrator comprises a current source coupled to the output node and configured to hold the fine control signal at the second voltage, wherein the integrator further comprises a plurality of charge storage elements coupled to the output node and configured to store a charge equal to a voltage of the fine control signal; and a bias adjust circuit configured to adjust a voltage of the fine control signal from a first voltage to a second voltage based on the pulse received via the adjustment signals.

11. The duty cycle correction circuit of claim 10, wherein the bias adjust circuit comprises an adjustment charge storage element has less storage capacity than the charge storage elements of the plurality of charge storage elements.

12. The duty cycle correction circuit of claim 11, wherein the bias adjust circuit further comprises:
a first pass gate configured to selectively decouple the adjustment charge storage element from an output node of the integrator responsive to the first control signal; and
a second pass gate configured to selectively decouple the adjustment charge storage element from the output node of the integrator responsive to the second control signal.

13. A method comprising:
receiving a pulse of a pulse signal at a duty cycle correction (DCC) circuit;
responsive to receiving a pulse signal, adjusting a duty cycle of an input signal by a first amount that is equal to one or more unit adjustments of a duty cycle adjustment circuit of the DCC circuit;
responsive to receiving a pulse signal, adjusting the duty cycle of the input signal by second amount that is equal to less than one unit adjustment of the duty cycle adjustment circuit, wherein the less than one unit adjustment is based on a voltage of a fine control signal; and
after receiving the pulse signal, maintaining the fine control signal at the second voltage using a current mirror circuit and one or more charge storage elements.

14. The method of claim 13, further comprising:
receiving a delay adjust signal;
responsive to receiving the pulse of the pulse signal, increasing the voltage of the fine control signal from the first voltage to the second voltage based on the delay adjust signal having a first logical value; and
responsive to receiving the pulse of the pulse signal, decreasing the voltage of the fine control signal from the first voltage to the second voltage based on the delay adjust signal having a second logical value.

15. The method of claim 14, wherein adjusting e of the fine control signal from the first voltage to the second voltage comprises:
responsive to receiving a start of the pulse of the pulse signal:
decoupling a charge storage element from the output node of the fine adjust control circuit;

coupling the charge storage element to a voltage source to adjust a voltage of the charge storage element from a first bias voltage; and
responsive to receiving an end of the pulse of the pulse signal; coupling the charge storage element to the output node of the fine adjust control circuit to adjust the fine control signal to the second voltage.

16. The method of claim 15, wherein decoupling the charge storage element from the output node of the fine adjust control circuit comprises disabling a pass gate.

17. A method comprising:
receiving a pulse of a pulse signal and delay adjust signal at a duty cycle correction (DCC) adjustment circuit;
responsive to receiving the pulse of the pulse signal:
adjusting a charge on a charge storage element of a fine adjust control circuit of the DCC adjustment circuit from a first voltage to a second voltage; and
integrating the charge on the charge storage element with charges on other charge storage elements of the fine adjust control circuit of the DCC adjustment circuit to provide a fine control voltage, wherein the fine control voltage adjusts a duty cycle of a signal received at the DCC adjustment circuit.

18. The method of claim 17, further comprising, responsive to receiving the pulse of the pulse signal:
adjusting the duty cycle of the signal by a first amount by enabling one or more duty cycle adjust elements of the DCC adjustment circuit via corresponding coarse control signals; and
adjusting the duty cycle of the signal by a second amount by adjusting a drive strength of a duty cycle adjust element of the DCC adjustment circuit based on the fine control voltage.

19. The method of claim 18, wherein adjusting the duty cycle of the clock signal by the second amount comprises setting the fine control signal to a voltage between a first voltage and a second voltage, and wherein adjusting the duty cycle of the clock signal by the first amount comprises:
independently setting each of the coarse control signals corresponding to the one or more duty cycle adjust elements to the first voltage; and
holding coarse control signals corresponding to remaining duty cycle adjust elements of the DCC adjustment circuit at the second voltage.

20. The method of claim 17, wherein adjusting the duty cycle of the input signal by the second amount is while the DCC adjustment circuit is in a normal operating mode.

* * * * *